United States Patent [19]

Brant et al.

[11] Patent Number: 4,831,496

[45] Date of Patent: May 16, 1989

[54] GROUND FAULT RECEPTACLE CIRCUITRY COMPONENTS

[75] Inventors: Edward J. Brant, Mattydale; Thomas N. Packard, Syracuse; Daniel A. Fargeaud, Dewitt, all of N.Y.

[73] Assignee: Pass & Seymour, Inc., Syracuse, N.Y.

[21] Appl. No.: 178,628

[22] Filed: Apr. 7, 1988

[51] Int. Cl.[4] ............ H05K 5/00

[52] U.S. Cl. ............ 361/394; 361/395

[58] Field of Search ............ 174/51, 53; 335/6, 18, 335/192; 361/41, 45, 49, 356–357, 392, 394–395, 399

[56] References Cited

U.S. PATENT DOCUMENTS

| | | | |
|---|---|---|---|
| 4,521,824 | 6/1985 | Morris et al. | 361/394 |
| 4,549,241 | 10/1985 | Morris et al. | 361/394 |
| 4,595,894 | 6/1986 | Doyle et al. | 335/18 |

*Primary Examiner*—A. D. Pellinen
*Assistant Examiner*—Gregory D. Thompson
*Attorney, Agent, or Firm*—Charles S. McGuire

[57] ABSTRACT

A duplex wall receptacle having ground fault current interrupting capability includes an internal switch operable by manual depression of a button accessible on the front of the receptacle to test the device for proper operation. A blade of conducting material includes a first end portion which is held in contact with, but physically unattached to, one of the terminals to which one of the hot and neutral lines is attached on one side of the fault sensing means. A medial portion of the blade extends laterally across the interior of the receptacle, and a second end portion is positioned in normally spaced relation to a conducting member which is electrically connected to the terminal to which the other of the hot and neutral lines is attached on opposite side of the fault sensing element. Depression of the test button moves the medial portion and second end portion of the blade, placing the latter in contact with the conducting member to simulate a fault condition.

10 Claims, 5 Drawing Sheets

F/G. 3

GROUND FAULT RECEPTACLE CIRCUITRY COMPONENTS

This application is a division of copending application Ser. No. 005,100 filed Jan. 20, 1987 now abandoned.

BACKGROUND OF THE INVENTION

The present invention relates to electrical receptacles having ground fault circuit interruption capability, hereinafter termed GFI receptacles; and more specifically, the invention relates to novel constructions and arrangements of circuitry components of such receptacles.

In addition to the usual load terminals, mounting strap, body and housing portions etc. of standard wall receptacles, GFI receptacles include means for sensing an imbalance in current flow through the hot and neutral conductors, circuit means responsive to such imbalance for generating a "trip" signal, and a set of contacts movable to open the circuit in response to the trip signal. A wound toroidal core through which the condcutors pass to provide current-sensing transformers is commonly used as the sensing means, and a solenoid including a coil and movable armature, together with appropriate mechanical couplings and biasing means, functions as the contact-opening means. In addition, GFI receptacles must include means for intentionally introducing a trip signal to permit periodic testing of the device, and means for resetting the contacts in their original position after tripping. It is also desirable that the circuit means include protective means for preventing damage to circuit components due to the presence of momentary high voltage spikes caused by lightning strikes, or other transient conditions.

Although GFI receptacles require a great deal many more components, both electrical and mechanical, than ordinary wall receptacles, it is desirable that the overall size of the two be essentially the same in order to permit mounting in the same, standard junction boxes. This requirement has led to the development of various improvements in the design and construction of GFI receptacles, including miniaturization of circuit components and the layout thereof, the use of certain components, both mechanical and electrical, to perform multiple functions, etc. In some cases, however, reductions in the size and number of components to fit in a given space and still provide a variety of desired functions has resulted in greater complexity and cost of fabrication of GFI receptacles.

It is a principal object of the present invention to provide a GFI receptacle having electrical and mechanical components of GFI cicuitry which permit compact and economical construction and, at the same time, provide ease of fabrication and assembly.

A more specific object is to provide a circuit design for incorporation in a GFI receptacle which includes means for protecting circuit components from damage due to circuit transients, yet eliminates the elements commonly used to provide this function.

A further object is to provide GFI receptacle circuitry having novel and improved means for testing proper operation of the device.

Another object is to provide a GFI receptacle having a circuit board with all components surface mounted in a compact format.

A still further object is to provide a GFI receptacle having novel and improved means for mounting the ground fault sensing and grounded neutral coils, as well as the solenoid coil, on the circuit board which carries the GFI circuit components.

Other objects will in part be obvious and will in part appear hereinafter.

SUMMARY OF THE INVENTION

In accordance with the foregoing objects, the present invention contemplates a GFI receptacle including a circuit board carrying on one surface all of the components, e.g., resistors, capacitors, diodes, transistors, etc., which make up the GFI circuitry for processing the fault signals and generating trip signals. The fault signals are generated in the usual manner by a pair of conductors connected between the source of power and the load and passing through wound toroidal cores one of which senses an imbalance in current flow in the conductors and the other providing grounded neutral protection. A ground fault or similar circuit disfunction producing a disparity in current flow in the conductors causes a signal to be generated in one of the coil windings. The latter is connected to the GFI circuitry, which loads it with a low impedance and causes the coil to respond as a current source. The coil of an electromechanical solenoid is also connected in the GFI circuit. The fault signal generated by the windings is translated to a signal which energizes the solenoid coil, moving an armature which, through appropriate mechanical linkages, results in movement of a pair of contacts to open the circuit between the source and load.

In the receptacle of the present invention, in addition to mounting all of the GFI circuit components on one surface of a wiring board, the sensing coils, solenoid components, movable contacts and other elements for effecting opening of the circuit are mounted on the opposite surface with the necessary mechanical and electrical connections extending through the board. This innovation provides a compact and easily handled sub-assembly which may be fabricated largely by automated techniques. Notches or cut-out areas in the circuit board provide isolation of GFI circuit components from the power terminal connections to protect the components from damage due to momentary, high voltage spikes, thus eliminating the need for other components normally used to provide this function.

The receptacle of the invention further includes simple yet effective means for testing the device for proper operation. Such testing means are required in all approved GFI receptacles, and are normally provided by a button accessible on the exterior of the housing which is depressed to produce an electrical connection within the receptacle which simulates the presence of a ground fault condition. Thus, if all components are operating properly, the circuit is opened in response to depressing the test button, and is closed again by operation of a reset button. In the present GFI receptacle, a blade of flexible material has a medial portion extending laterally across the interior of the receptacle for contact and movement by a pin extending from the manually engageable test button. A first end portion of the test blade is captured in a recess between a plastic part which separates the interior of the receptacle into upper and lower compartments and one of the metal load terminals. The first end portion, although not physically attached to any other part, has a convex electrical contact extending therefrom into an opening in the load terminal. When the test button is depressed to move the medial portion of the test blade, a twisting force is thereby applied to the first end portion, urging it into tight contact with the load terminal. Movement of the medial portion of the test blade also moves a second end portion thereof into engagement with one end of an electrically conducting pin which is connected at its other end at an appropriate point in the GFI circuitry. A simulated "fault" signal is produced by connection of the load terminal, through the test blade and the pin, to the GFI circuitry, thereby energizing the solenoid and opening the circuit contacts and confirming proper operation of all components of the receptacle. The test blade returns to its original position under its own natural resiliency when the test button is released.

DETAILED DESCRIPTION

Figure 1:
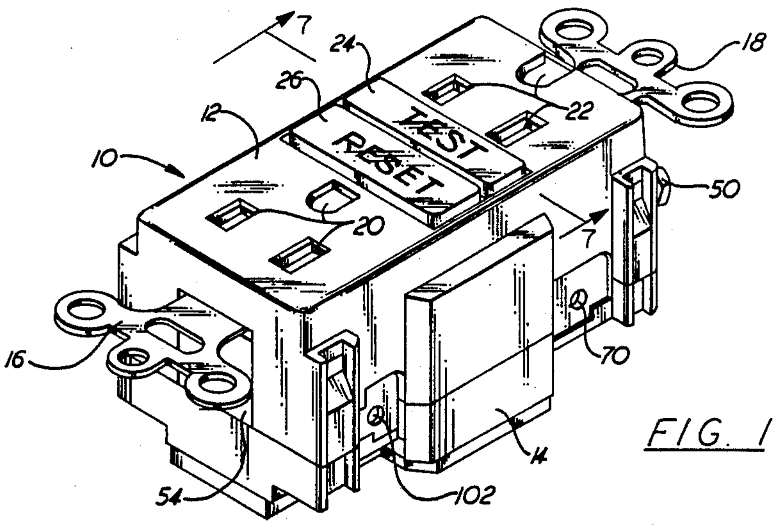
FIG. 1 is a perspective view of a fully assembled GFI receptacle embodying the present invention.

Referring now to the drawings, in FIG. 1 is seen a duplex electrical wall receptacle 10 incorporating the automatic circuit interruption features of the present invention. The usual housing means for the components of GFI receptacle 10 is provided by mating front and rear body portions 12 and 14, respectively. A preferred means of assembly and mating engagement of body portions 12 and 14 is described in detail in copending application Ser No. 005,085, filed of even date herewith, but forms no part of the present invention.

Figure 2:
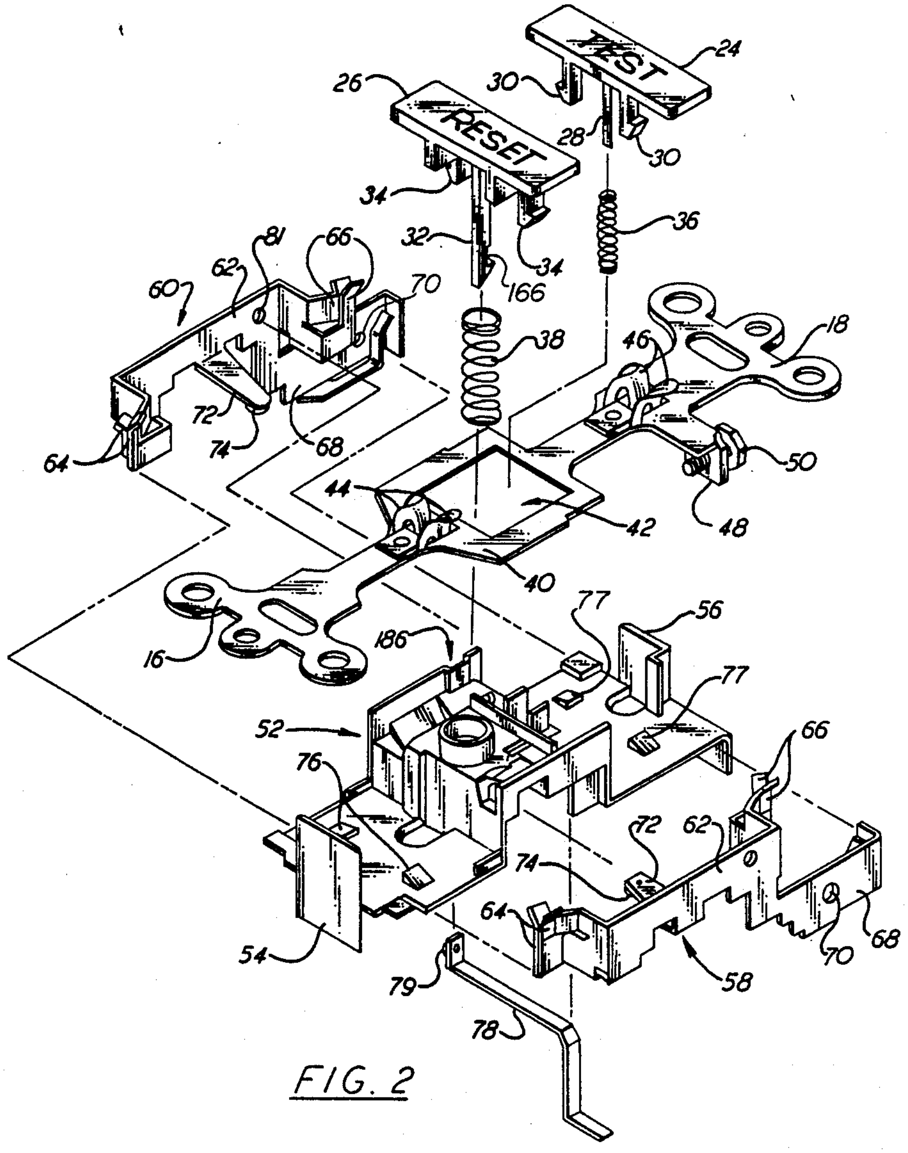
FIG. 2 is an exploded perspective view of certain elements of the receptacle of FIG. 1.

Mounting ears 16 and 18 on the grounding strap, shown more fully in FIG. 2, extend through openings in opposit ends of the receptacle housing means. Two sets of openings 20 and 22 are provided in front body portion 12 to receive the prongs of conventional plugs on the ends of line cords connected to an appliance, tool, or other electrical load which receives power through GFI receptacle 10. It should be understood that the principles of the present invention are not limited to employment with duplex-type receptacles, although certain constructional features are particularly suited to such receptacles and are so indicated in the claims. Manually engageable test and reset buttons 24 and 26, respectively, accessible on the front of housing section 12, are positioned one over the other between the two sets of openings 20 and 22.

Referring now to FIG. 2, pin 28 and arms 30 extend integrally from test button 24; similarly, stem 32 and arms 34 extend integrally from reset button 26. The buttons, pins and arms are preferably formed as one-piece plastic moldings, with the arms having limited flexibility for movement with respect to the associated buttons for purposes of assembly with body portion 12 in the manner explained in previously referenced application Ser. No. 005,085. Coil springs 36 and 38 surround pins 28 and 32, respectively, to urge buttons 24 and 26 toward an outward position with respect to body portion 12, as also explained in more detail hereinafter.

With continuing reference to FIG. 2, grounding strap 40, with mounting ears 16 and 18 on opposite ends thereof, is seen to be essentially flat, having central opening 42, on opposite sides of which are connected prong receptacles 44 and 46. In the assembled condition of GFI receptacle 10, prong receptacles 44 and 46 are aligned with the uppermost of openings 20 and 22 to receive the grounding prong of a plug connected to the receptacle. Ear 48 is bent downwardly from strap 40 and has a threaded opening to receive screw 50 for connection of an external ground wire.

A unitary, molded plastic element with compound surfaces, termed a separator and denoted by reference numeral 52 is also shown in FIG. 2. Separator 52 includes end wall portions 54 and 56 which mate with portions of housing sections 12 and 14 to form exterior portions of the housing of receptacle 10, part of end wall portion 54 being seen in FIG. 1. Separator 52 extends across the interior of receptacle 10 essentially from side to side and end to end, separating the interior of the receptacle into two compartments, with the grounding strap and plug prong receiving contacts on the load terminals on one side and the ground fault circuitry, solenoid, fixed and movable contacts and wire termination connections on the other side.

Separator 52 further serves as a support for load terminals 58 and 60, which are mounted upon the separator to provide a sub-assembly of the receptacle. Load terminals 58 and 60 are formed from single sheets of high conductive metal such as brass or copper, bent to the desired configuration. Each of load terminals 58 and 60 includes side portion 62, having angularly extending portions 64 and 66 at opposite ends which form resilient contacts for receiving the prongs of plugs inserted in receptacle 10. Extending downwardly and outwardly from one of the ends of side portions 62 are wire termination arms 68, each having a threaded opening 70, the opening in the termination arm of terminal 58 being shown in FIG. 2, also in FIG. 1 where it is seen to be accessible from the exterior of receptacle 10. Thus, the load wires of the electrical circuit which includes receptacle 10 may be connected to load terminals 58 and 60 by screws inserted in openings 70 as described in aforementioned application Ser. No. 005,085.

Contact arms 72 extend inwardly from side portions 62 of load terminals 58 and 60. Rounded electrical contacts 74 are affixed to the lower (as viewed in FIG. 2) surfaces of arms 72 near the terminal ends thereof. As explained later, contacts 74 provide the fixed set of contacts through which the circuit is interrupted upon the occurrence of a ground fault or similar circuit malfunction. Load terminals 58 and 60 are assembled with separator 52 by a metal-to-plastic snap fit of the lower edges of angularly extending portions 64 and 66 over ramped portions 76 and 77, respectively, on the upper surface of separator 52, as also explained in application Ser. No. 005,085.

A further element shown in FIG. 2 which forms an important part of the present invention is flexible blade 78, of electrically conducting material. As explained later in more detail, blade 78 forms a portion of the switch through which proper operation of the mechanical and electrical components of receptacle 10 may be tested. Convex detent 79 is formed in an end portion of blade 78 adjacent an end portion thereof, and extends into opening 81 in load terminal 60 in the assembled condition of the elements, but is not physically attached to the load terminal or to any other element.

Figure 3:
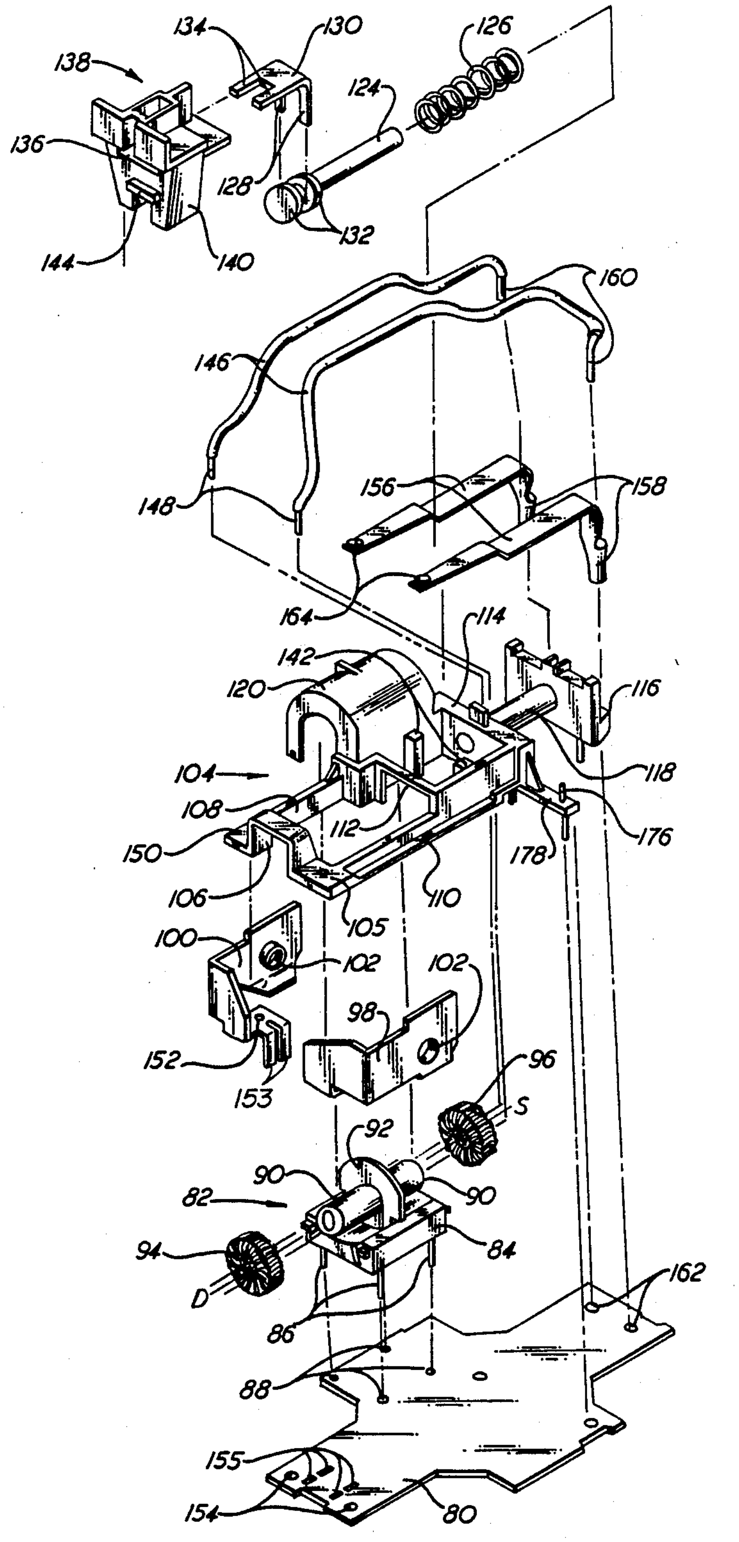
FIG. 3 is an exploded, perspective view of additional elements of the receptacle.
Figure 4:
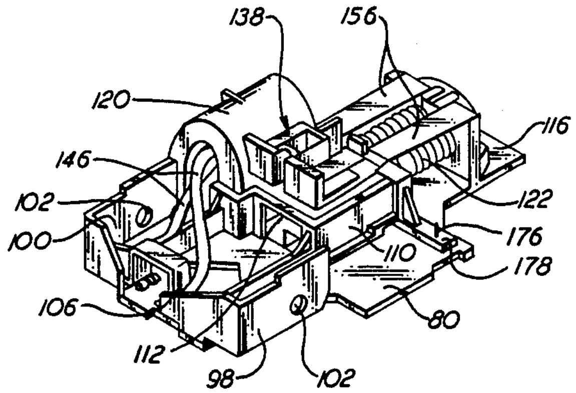
FIG. 4 is a perspective view of the elements of FIG. 3, shown in assembled relation.

Elements of a further subassembly of receptacle 10 are shown in exploded perspective in FIG. 3, and in assembled perspective in FIG. 4. The individual components of the ground fault electronic circuitry are all surface-mounted on the front surface of circuit board 80, and the back surface of which is seen in FIGS. 3 and 4, and the front surface in FIG. 6. In distinction from prior ground fault receptacles of this type, the sensing coils, relay, movable contacts, and other elements of the ground fault system are mounted on the rear surface of the board by means of portions extending through the board, some of which provide both necessary electrical connections as well as physical support. Unitary, molded plastic part 82 includes base portion 84 with four pins 86, extending downwardly therefrom for insertion through openings 88 in board 80. Hollow cylindrical portion 90 extends through wall member 92, all being integral portions of plastic part 82. Coils 94 and 96 are mounted upon cylindrical portion 90, on opposite side of wall member 92, and comprise toroidal cores wrapped with multiple turns of copper wire in the usual fashion. It is preferred that the cores of coils 94 and 96 be of the ferrite type. Terminals 98 and 100 for the line wires of the circuit in which receptacle 10 is connected include threaded openings 102 for receiving a screw to effect connection of the line wires to the terminals, the opening 102 of one of the terminals being seen in FIG. 3. Terminals 98 and 100 also include means for effecting push wire terminations, alternatively to the screw connections.

A second unitary molded plastic part 104 includes forward frame portion 106, side frame portions 108 and 110, intermediate frame portion 112, and two rear frame portions 114 and 116, held in spaced relation by hollow, cylindrical member 118. Curved housing portion 120 extends from side frame portion 108, and is arranged in covering relation to coils 94 and 96 in the fully assembled condition of the subassembly, as shown in FIG. 4. Solenoid coil 122 (FIG. 4) encircles cylindrical member 118, and armature 124, biased to an outer position by spring 126, travels within hollow member 118 to an inner position when coil 122 is energized.

Lower legs 128 of L-shaped latch member 130 straddle armature 124 between spaced collars 132. Upper legs 134 of latch member 130 are inserted into through slot 136 of molded plastic latch block 138. Lower portion 140 of the latch book is slidingly received in a recess in plastic part 104 between intermediate wall portion 112 and posts 142 for reciprocating, up and down movement. When the parts are assembled, lip 144 on latch block 138 snaps under intermediate wall portion 112 to prevent the latch block from moving upwardly, out of the recess, beyond the point where lip 144 contacts the lower edge of wall portion 112. Legs 128 and 134 of latch member 130 are long enough, relative to the travel of armature 124 and latch block 138, that neither is withdrawn from engagement over armature 124 and within slot 136 by movement of the parts during operation of the ground fault interrupting elements.

Wires 146 pass through hollow portion 90 of part 82, and thus through coils 94 and 96. Ends 148 of wires 146 pass through openings 150 in forward frame portion 106 of part 104, openings 152 in terminals 98 and 100, being electrically connected to the terminals, and through openings 154 in circuit board 80. Legs 153 of terminals 98 and 100 pass through openings 155 in board 80. A pair of spring arms 156 have end portions 158 which are anchored in openings end wall portion 116. Ends 160 of wires 146 pass through and are electrically connected, e.g., by soldering, to end portions 158, and further pass through the openings in end wall portion 116 and openings 162 in circuit board 80. Rounded contacts 164 are carried on the free ends of spring arms 156.

During normal operation, the free ends of spring arms 156 are held in a flexed position, with contacts 164 in engagement with contacts 74 to complete the circuit, by latch block 138, upon which the free ends of the spring arms rest. The latch block is held in position, against the biasing force of the spring arms, by the engagement of latch member 130 with stepped lip 166 (FIG. 2) on stem 32 of reset button 26, which is maintained in position by spring 38. When a circuit fault condition occurs, as explained later, solenoid coil 122 is energized to move armature 124 and latch member 130, thereby disengaging the latter from lip 166 and permitting the free ends of spring arms 156 to move latch block 138 as they return to their unflexed position. This movement of the spring arms breaks the engagement between contacts 164 and 74, thus opening the circuit between the source and load to remove the unsafe condition. The elements are replaced in their normal operating positions by depression of reset button 26. Movement of the elements to open and close the circuit through contact 164 and 74 is illustrated and described more fully in copending application Ser. No. 005,086.

Figure 5:
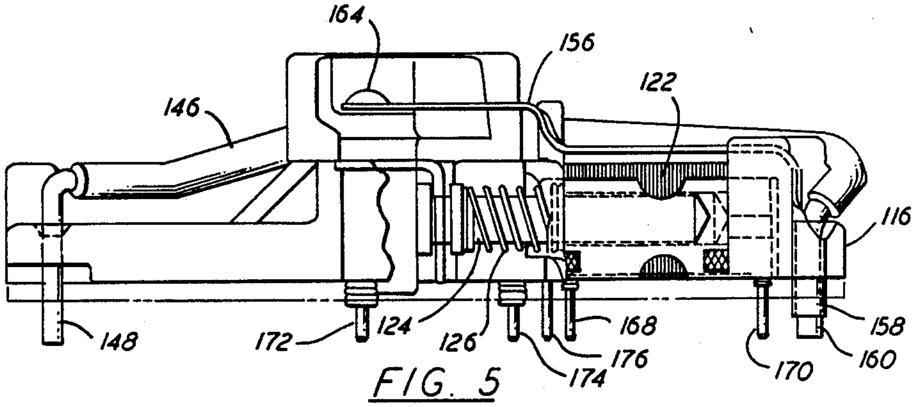
FIG. 5 is an enlarged, side elevational view of the sub-assembly of FIG. 4, with portions broken away.
Figure 6A:
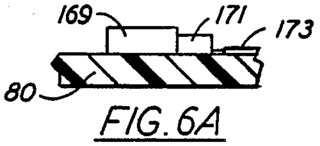
FIGS. 6A and 6B are enlarged, fragmentary, side elevational views taken on the lines 6A—6A and 6B—6B, respectively, of FIG. 6.
Figure 6B:
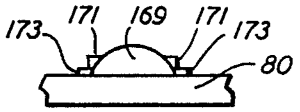
Figure 6:
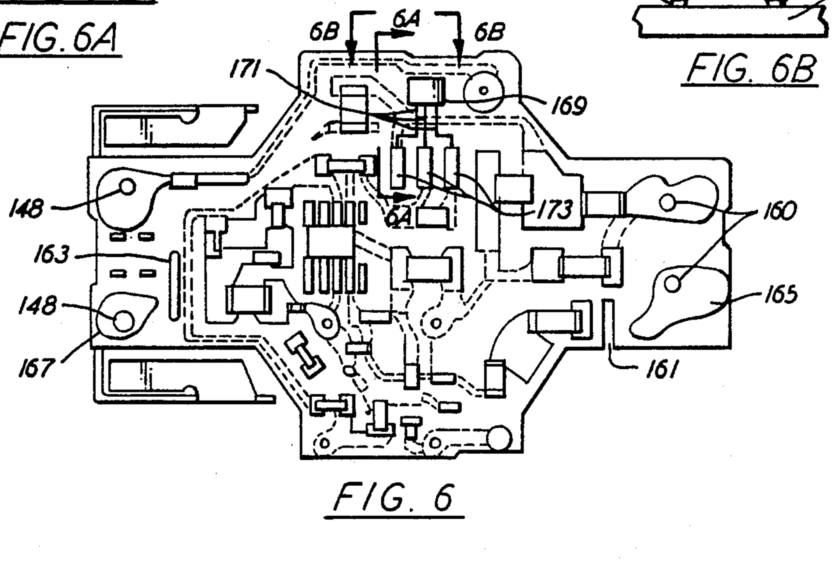
FIG. 6 is a plan view of the surface of the circuit board of the receptacle upon which the components of the GFI circuitry are mounted.

The electrical connections of components mounted on the rear surface of circuit board 80 with the circuitry on the front surface are shown in FIGS. 5 and 6. End portions 158 of spring arms 156, with ends 160 of wires 146 passing therethrough extend through openings in end frame portion 116 of part 104 and openings 162 (FIG. 3) in circuit board 80. Ends 168 and 170 of solenoid coil 122 extend through the board at intermediate positions thereon, as do ends 172 and 174 of coils 94 and 96. Pin 176 extends through both extension 178 of side frame portion 110 of plastic part 104 and circuit board 80. All of the wiring contacts extending through circuit board 80 are trimmed as necessary on the front surface thereof and incorporated into the GFI circuitry printed on the board by conventional soldering techniques, thus providing both electrical connections and physical support between the components mounted on the rear surface of the board and the circuitry carried on the front surface thereof.

Two other important features of the GFI circuitry are shown in FIGS. 6, 6A and 6B. One such feature is provided by cut-out areas in the form of elongated slots 161 and 163 in circuit board 80 between soldered connections 165 and 167 of the one of wires 146 which forms part of the hot conductor of the circuit in which the receptacle is connected and components of the GFI circuit nearest thereto. These discontinuities in board 80 insure that high transient voltages, e.g., up to 6KV, will not cause damage to circuit components and are the sole means of providing such protection, thereby eliminating the use of additional components such as varistors, movistors, or the like, commonly used for this purpose in GFI circuits.

The other feature resides in the surface mounting of the SCR component on board 80, as opposed to the conventional mounting of SCRs on the opposite side of the board, with leads extending through the board for connection to the printed wiring, even where other components are surface mounted. The body 169 of the SCR is of the usual, semi-cylindrical configuration, with two flat ends and one flat side. The three leads 171 extending from one of the flat ends are bent downwardly and outwardly, as seen in FIG. 6A, for connection to solder pads 173 in the GFI circuit. In assembly, the flat side of body 169 is secured to the front surface of board 80 with an adhesive so that the board may be passed through the surface-mount wave soldering operation with the front surface facing downward, in the usual manner.

Figure 7:
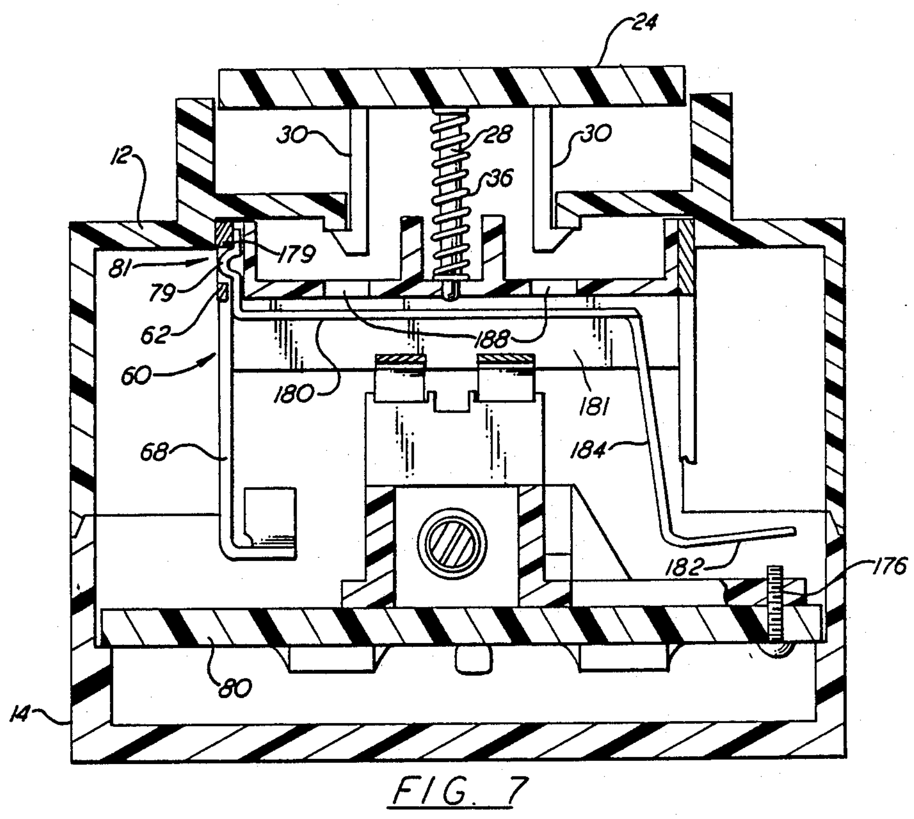
FIGS. 7 and 8 are end elevational views, in section taken on the line 7—7 of FIG. 1, showing certain elements of the receptacle in two positions of operation.
Figure 8:
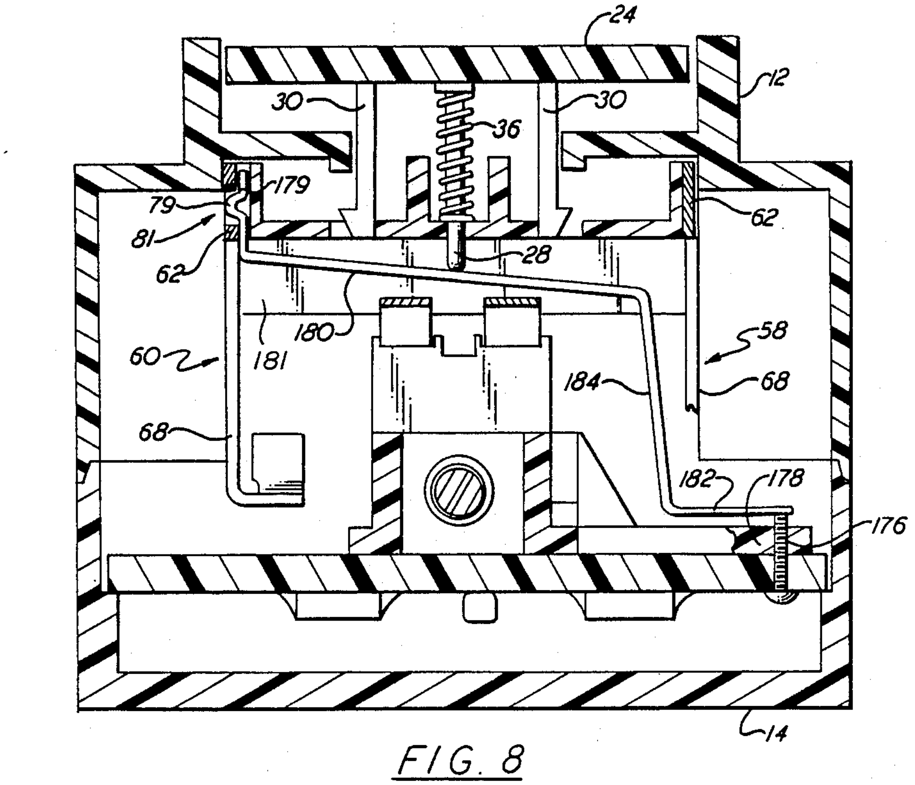

Turning now to FIGS. 7 and 8, the structure and function of the components for testing operation of the GFI receptacle are shown. Blade 78 includes first end portion 179, carrying rounded detent 79, extending upwardly from medial portion 180. Second end portion 182 extends outwardly from portion 184 which, in turn, extends downwardly from medial portion 180 (referring to the positions illustrated in FIGS. 7 and 8). In the assembled condition, first end portion 179 is positioned within a recess of separator 52 indicated in FIG. 2 by reference numeral 186, with rounded detent 79 extending into opening 81 of load terminal 60, as previously described. Medial portion 180 extends transversely across the interior of the receptacle, through a channel in the lower surface of separator 52, one side surface of which is seen in FIGS. 7 and 8, denoted by reference numeral 181, immediately below pin 28 of test button 24. The normal position of such elements is shown in FIG. 7. When operation of receptacle 10 is tested, test button 24 is manually depressed, against the bias of spring 36, moving the elements from the position of FIG. 7 to that of FIG. 8. Pin 28 projects through an opening provided therefor in separator 52 and contacts medial portion 180 of blade 78, moving it downwardly, causing second end portion 182 to contact pin 176. Although first end portion 179 is normally in contact with load terminal 60, this movement of blade 78 produces a turning movement of first end portion 179, forcing it and detent 79 into tight engagement with load terminal 60. Thus, depression of test button 24 provides immediate electrical contact, through blade 78 and pin 176, between load terminal 60 and the GFI circuitry on board 80. Openings 188 (Fig. 7) in separator 52 provide clearance for legs 30 on test button 24 when the latter is depressed to the position of FIG. 8.

Figure 9:
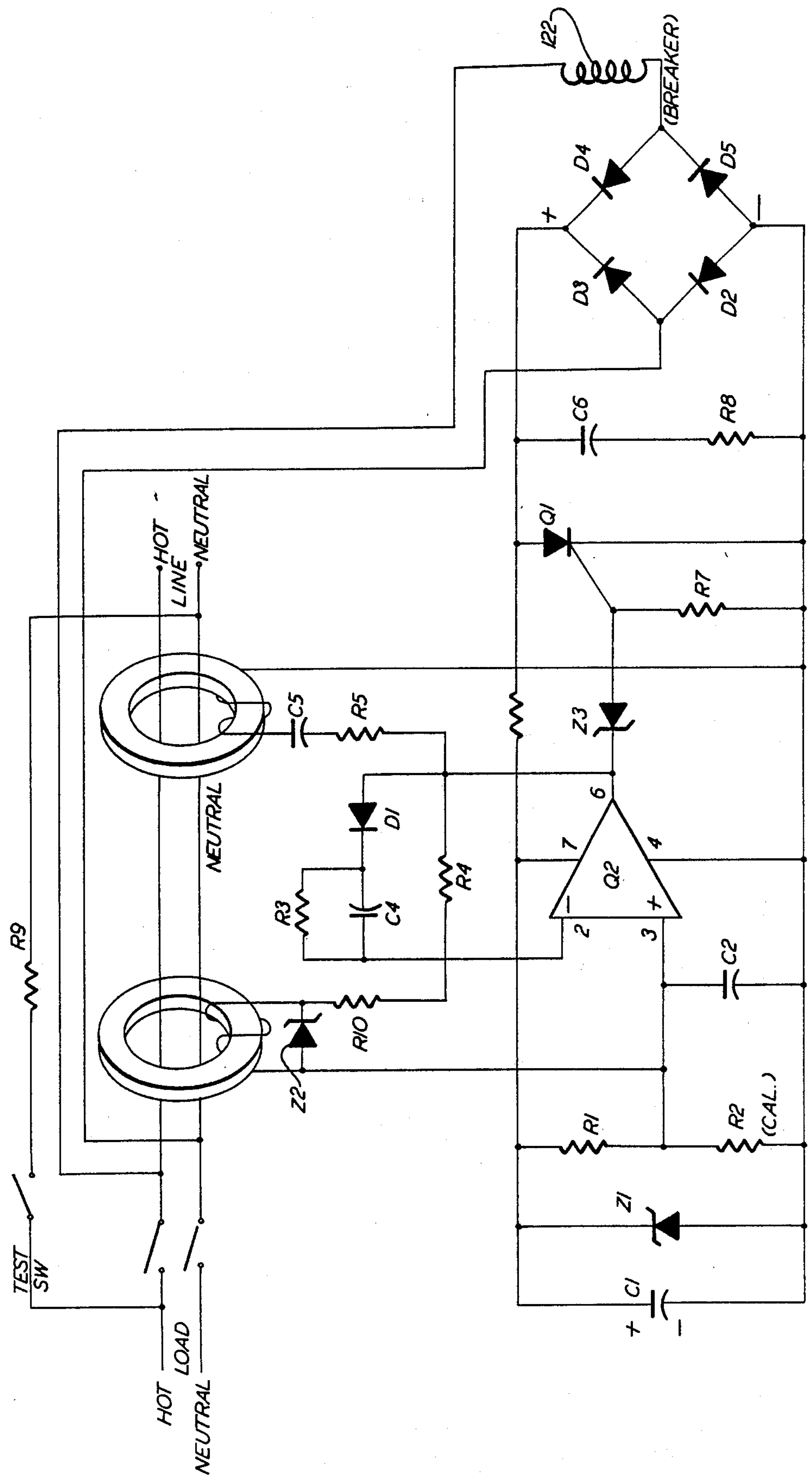
FIG. 9 is a schematic diagram of the GFI circuit.

Operation of the previously described mechanical and electrical components will now be related to the schematic diagram of FIG. 9. Wires 146, as previously explained, are connected at opposite ends to points on circuit board 80 which are in electrical communication with line terminals 58 and 60, and load terminals 98 and 100, through fixed and movable contacts 74 and 164, respectively. Wires 146 pass through toroidal coils 94 and 96 and any imbalance of current flow through the wires, such as that which occurs when a ground fault develops, induces a current in coil 96. The leads from coil 96 are connected to inverting and non-inverting inputs 2 and 3, respectively, of operational amplifier Q2. When the output of amplifier Q2 exceeds the avalanche voltage of zener Z3, the voltage applied to the gate of SCR Q1 permits current flow therethrough, thus creating a short circuit between the positive and negative sides of the full wave bridge formed by diodes D2–D5. This has the effect of connecting the AC line across coil 122 of the solenoid, moving the armature thereof and the latching elements in the manner previously described to disengage contacts 74 and 164, thereby opening the circuit and removing power from the load.

Amplifier Q2 functions in the same manner as the GFI circuitry of U.S. Pat. Nos. 3,936,699 and 4,024,436, both of William H. Adams, and 4,574,324 of Thomas N. Packard, all assigned to applicants' assignee, to which reference may be made for any additional details of operational description. The present GFI circuitry, as well as that of the referenced patents, is so configured that by using a high gain amplifier the apparent load resistance (across inputs 2 and 3) is very small, to the point of being essentially a short circuit. Accordingly, the output voltage of the transformer formed by wires 146 as the primary and coil 96 as the secondary, is essentially independent of core permeability, allowing the use of less expensive ferrite cores, which is preferred in the present circuitry. Coil 94 forms the primary and wires 146 the secondaries of a second differential transformer, providing circuit-opening operation in the event the neutral conductor is grounded at the load side. A few millivolts are coupled by this transformer to wires 146 which, under normal conditions, produces no current in the wires since there is no return path. If a low impedance to ground is established in the neutral conductor at the load side, however, a return path is established and the few millivolts coupled to wires 146 by coil 94 will cause some current flow through coil 96. This current flow will become large enough to generate in coil 96 a voltage equal to the voltage at coil 94 divided by the gain of amplifier Q2, and the latter will break into self-sustained oscillation. The voltage at output pin 6 of amplifier Q2 will exceed the breakover voltage of zener Z3 and SCR Q1 will fire, causing energization of coil 122 and opening of contacts 74 and 164 as previously described.

What is claimed is:

1. In GFI receptale for connecting and disconnecting each of a single hot and a single neutral conductor between a source of electrical power and a load, means for testing operation of electrical and mechanical components of the receptacle, said means comprising:

(a) a pair of toroidal current sensing means (94,96) through which both of said hot and neutral conductors (146) pass;

(b) a first terminal (60) electrically connected to one of said hot and neutral conductors on one side of said sensing means;

(c) a second terminal (98) electrically connected to the other of said hot and neutral conductors on the opposite side of said sensing means from said first terminal;

(d) a conducting member (176) in electrical communication with said second terminal and fixedly positioned within said receptacle;

(d) a test button (24) manually movable between first and second positions against the force of biasing means normally holding said button in said first position;

(f) a blade (78) of flexible, electrically conducting material having a first end (179) positioned in physical contact with said first terminal, a medial portion (180) extending across the interior of said receptacle, and a second end (182) positioned in spaced proximity to said conducting member; and (g) an operating portion (28) of said test button extending into said receptacle to contact and move said medial portion of said blade upon movement of said button to said second position thereof, thereby moving said second end of said blade into contact with said conducting member and placing said first and second terminals in direct electrical communication.

2. The invention according to claim 1 wherein said blade first end is physically unattached to any other structure.

3. The invention according to claim 2 wherein said blade in its entirety is physically unattached to any other structure.

4. The invention according to claim 3 and further including a molded plastic part mounted within said receptacle between said test button and said blade medial portion, said operating portion of said test button extending through an opening in said plastic part.

5. The invention according to claim 4 wherein said operating portion comprises a pin formed integrally with said test button.

6. The invention according to claim 4 wherein said plastic part extends across the interior of said receptacle, from side to side, and includes a channel in a surface thereof opposite said test button, said medial portion of said blade being positioned within said channel and said test button pin extends through an opening in said plastic part to contact said medial portion.

7. The invention according to claim 6 wherein said receptacle includes a housing having a front surface with two sets of openings therein to receive the prongs of electrical plugs connected to said receptacle, and said test button is mounted on said housing between said sets of openings.

8. The invention according to claim 6 wherein said test button extends substantially the full width of said housing front surface

9. The invention according to claim 6 wherein said first terminal and said plastic part include respective wall portions having surfaces facing and contacting one another, and one of said surfaces includes a recess wherein said first blade end is positioned in unsecured engagement with either of said surfaces.

10. The invention according to claim 9 wherein said first terminal includes an aperture and said first blade end further includes a detent extending into said aperture.

* * * * *